(12) United States Patent
Lu et al.

(10) Patent No.: US 12,627,276 B2
(45) Date of Patent: May 12, 2026

(54) POWER REGULATION CIRCUIT AND METHOD FOR CHIP

(71) Applicant: SHENZHEN PANGO MICROSYSTEMS CO., LTD., Shenzhen (CN)

(72) Inventors: Rangtian Lu, Shenzhen (CN); Xianhong Wang, Shenzhen (CN); Pengfang Lv, Shenzhen (CN); Changqing Wen, Shenzhen (CN); Aimei Liang, Shenzhen (CN)

(73) Assignee: SHENZHEN PANGO MICROSYSTEMS CO., LTD., Shenzhen (CN)

( * ) Notice: Subject to any disclaimer, the term of this patent is extended or adjusted under 35 U.S.C. 154(b) by 279 days.

(21) Appl. No.: 18/344,871

(22) Filed: Jun. 30, 2023

(65) Prior Publication Data

US 2023/0341883 A1 Oct. 26, 2023

Related U.S. Application Data

(63) Continuation of application No. PCT/CN2021/079740, filed on Mar. 9, 2021.

(30) Foreign Application Priority Data

Jan. 6, 2021 (CN) .......................... 202110014731.1

(51) Int. Cl.
*H03H 7/00* (2006.01)
*H02M 1/15* (2006.01)
(Continued)

(52) U.S. Cl.
CPC .............. *H03H 7/38* (2013.01); *H03H 7/004* (2013.01); *H05K 1/025* (2013.01);
(Continued)

(58) Field of Classification Search
CPC .. G05F 1/10; G05F 3/08; G05F 1/561; H03H 7/004; H03H 7/38; H03H 7/0115;
(Continued)

(56) References Cited

U.S. PATENT DOCUMENTS

| | | | |
|---|---|---|---|
| 5,926,061 A | 7/1999 | Usui | |
| 6,057,729 A * | 5/2000 | Nomura | G06F 1/305 327/592 |

(Continued)

FOREIGN PATENT DOCUMENTS

| | | |
|---|---|---|
| CN | 101071811 A | 11/2007 |
| CN | 101388603 A | 3/2009 |

(Continued)

OTHER PUBLICATIONS

WIPO, International Search Report for PCT Application No. PCT/CN2021/079740, Jul. 15, 2021.

(Continued)

*Primary Examiner* — Jue Zhang
*Assistant Examiner* — Ularislao Cordova

(57) ABSTRACT

Provided are a power regulation circuit and method for a chip, and a power supply circuit for a circuit. The power regulation circuit includes an LC circuit and an LC correction circuit. One terminal of the LC circuit is electrically connected to a positive pole of a chip and a positive electrode of a power supply. The other terminal of the LC circuit is electrically connected to a negative pole of the chip and a negative pole of the power supply. The LC correction circuit is electrically connected to the chip and the LC circuit, and is used to regulate a working parameter of the LC circuit according to the current working mode of the chip.

16 Claims, 7 Drawing Sheets

(51) Int. Cl.
    *H03H 7/38*         (2006.01)
    *H05K 1/02*         (2006.01)
    *H10W 44/00*     (2026.01)

(52) U.S. Cl.
    CPC ....... *H10W 44/401* (2026.01); *H10W 44/501*
        (2026.01); *H10W 44/601* (2026.01); *H02M*
                                *1/15* (2013.01)

(58) Field of Classification Search
    CPC ..... H01L 2924/301; H01L 2924/30101; H01L
              2924/30105; H01L 2924/30107; H01L
              2924/3011; H01L 23/64; G06F 1/26;
              H05K 1/025; H10W 44/401; H10W
              44/501; H10W 44/601; H02M 1/15
    See application file for complete search history.

(56) References Cited

U.S. PATENT DOCUMENTS

2008/0012661 A1\*   1/2008   Kim ..................... H05K 1/0231
                                           333/184
2009/0195295 A1\*   8/2009   Uematsu ................ H01L 23/50
                                           327/530

FOREIGN PATENT DOCUMENTS

| | | | |
|---|---|---|---|
| CN | 101499809 | A | 8/2009 |
| CN | 101527199 | A | 9/2009 |
| CN | 101834170 | A | 9/2010 |
| CN | 201590488 | U | 9/2010 |
| CN | 104502861 | A | 4/2015 |
| CN | 107612410 | A | 1/2018 |
| CN | 207638649 | U | 7/2018 |
| CN | 112154591 | A | 12/2020 |
| JP | 2001119110 | A | 4/2001 |
| JP | 2017093182 | A | 5/2017 |
| KR | 100813535 | B1 | 3/2008 |

OTHER PUBLICATIONS

CNINA, First Office Action for CN Application No. 202110014731.
1, Sep. 26, 2021.
CNINA, Office Action issued for CN Application No. 202110014731.
1, Mar. 3, 2022.
KIPO, Office Action for JP Application No. 10-2023-7015870, Aug.
17, 2025 (14 Pages).

\* cited by examiner

S110

Acquire a current working mode of the chip

S120

Adjust a parameter of the LC circuit according to the current working mode

S210

Acquire a current working mode of the chip

S220

Determine a current clock signal of the chip according to the current working mode

S230

Adjust the working parameter of the LC circuit according to the current clock signal

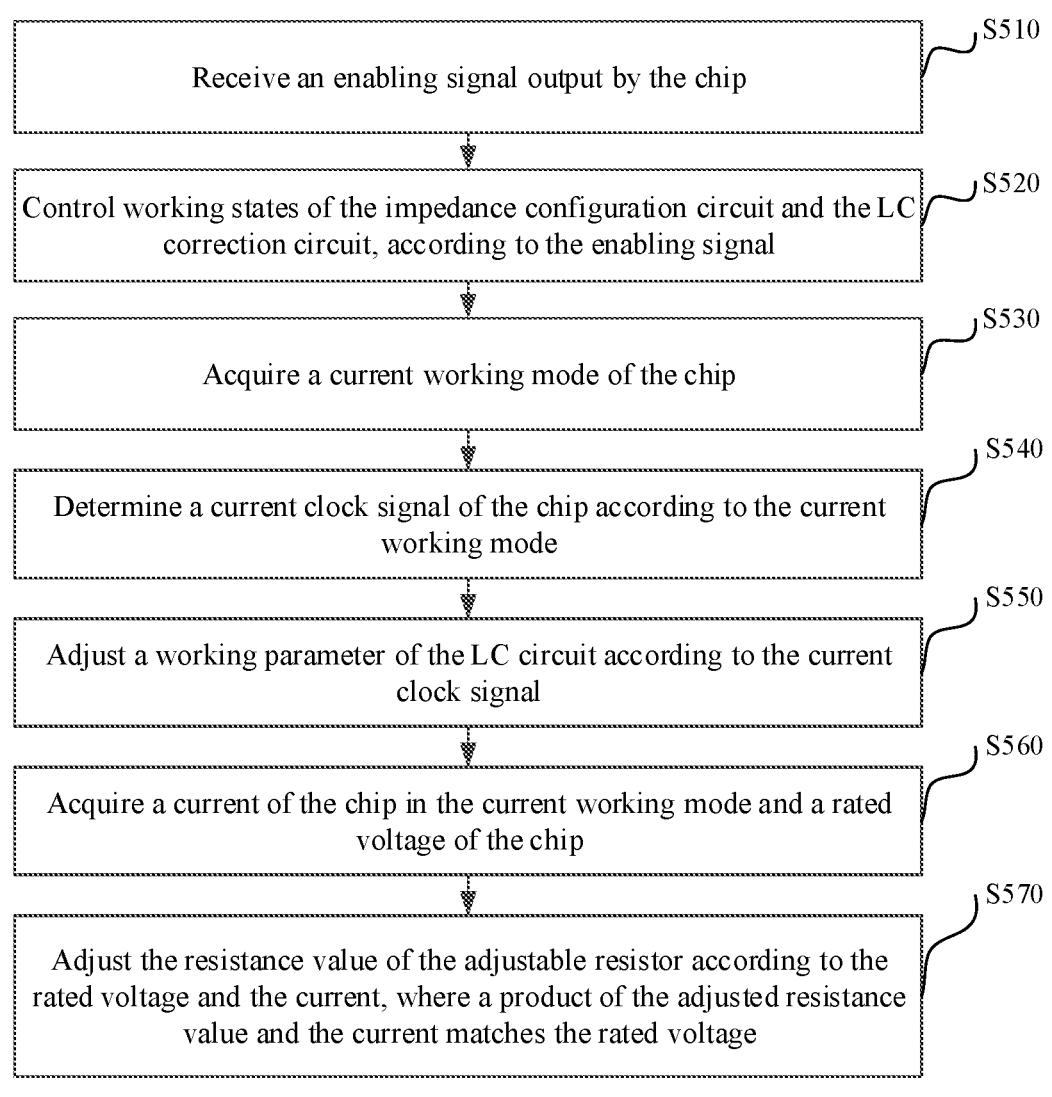

S510
Receive an enabling signal output by the chip

S520
Control working states of the impedance configuration circuit and the LC correction circuit, according to the enabling signal S530
Acquire a current working mode of the chip S540
Determine a current clock signal of the chip according to the current working mode S550
Adjust a working parameter of the LC circuit according to the current clock signal S560
Acquire a current of the chip in the current working mode and a rated voltage of the chip S570
Adjust the resistance value of the adjustable resistor according to the rated voltage and the current, where a product of the adjusted resistance value and the current matches the rated voltage

FIG. 10

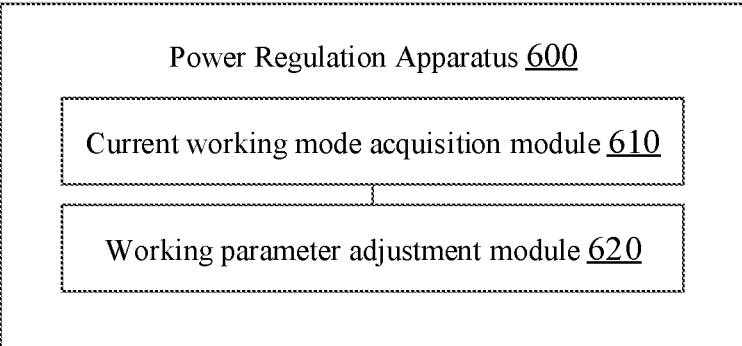

Power Regulation Apparatus 600

Current working mode acquisition module 610

Working parameter adjustment module 620

FIG. 11

POWER REGULATION CIRCUIT AND METHOD FOR CHIP

CROSS-REFERENCE OF RELEVANT APPLICATIONS

The present disclosure is a continuation of International Application PCT/CN2021/079740 filed on Mar. 9, 2021, which claims priority to a Chinese Patent Application No. 202110014731.1 filed on Jan. 6, 2021. The entire contents of these applications are incorporated herein by reference.

TECHNICAL FIELD

The present disclosure relates to the field of integrated circuits, and particularly relates to a power regulation circuit and method for a chip, and a power supply circuit for a chip.

BACKGROUND

In designing an integrated circuit, the power integrity should be considered to ensure the performance of a chip. For example, for a high-performance digital integrated circuit (IC) chip, such as a central processing unit (CPU) and a field programmable gate array (FPGA), while ensuring the power integrity of the chip during its operation, it is necessary to ensure that the power voltage of the chip is within a certain tolerance, and that a direct current error, a ripple, and a noise of the chip are all within an allowable range.

However, a power circuit generally has a fixed resonant frequency; and if the working frequency of the chip changes, the resonant frequency of the power circuit cannot match the working frequency of the chip, which cannot well ensure the power integrity of the chip.

SUMMARY

In view of the above, the present disclosure provides a power regulation circuit and method for a chip, and a power supply circuit for a chip.

In a first aspect, the embodiments of the present disclosure provide a power regulation circuit for a chip. The power regulation circuit includes an LC circuit and an LC correction circuit. One terminal of the LC circuit is electrically connected to each of a positive pole of the chip and a positive pole of a power supply, and the other terminal of the LC circuit is electrically connected to each of a negative pole of the chip and a negative pole of the power supply. The LC correction circuit is electrically connected to each of the chip and the LC circuit, and the LC correction circuit is used to adjust a working parameter of the LC circuit according to a current working mode of the chip.

In a second aspect, the embodiments of the present disclosure provide a power regulation method for a chip. The method is implemented by the power regulation circuit for a chip in the first aspect, and the method includes: acquiring a current working mode of the chip; and adjusting a working parameter of the LC circuit according to the current working mode.

In a third aspect, the embodiments of the present disclosure provide a power supply circuit for a chip. The power supply circuit includes a power supply, an LC circuit, and an LC correction circuit. One terminal of the LC circuit is electrically connected to each of a positive pole of the chip and a positive pole of the power supply, and the other terminal of the LC circuit is electrically connected to each of a negative pole of the chip and a negative pole of the power supply. The LC correction circuit is electrically connected to each of the chip and the LC circuit, and is configured to adjust a working parameter of the LC circuit according a current working mode of the chip.

In the power regulation circuit and method for a chip and the power supply circuit for a chip as provided in the embodiments of the present disclosure, the power regulation circuit for a chip is constituted by an LC circuit and an LC correction circuit. One terminal of the LC circuit is electrically connected to each of a positive pole of the chip and a positive pole of a power supply, and the other terminal of the LC circuit is electrically connected to each of a negative pole of the chip and a negative pole of the power supply. The LC correction circuit is electrically connected to each of the chip and the LC circuit. When the power supply supplies power to the chip, the LC correction circuit can adjust a working parameter of the LC circuit according to the current working mode of the chip, to enable self-adaptation of the resonant frequency of the power supply; and even if the working frequency of the chip changes due to the change of the working mode thereof, the power integrity of the chip can be ensured.

BRIEF DESCRIPTION OF THE DRAWINGS

To illustrate the technical schemes in the embodiments of the present disclosure clearly, drawings used in the description of the embodiments are briefly introduced below. Apparently, the drawings in the following description are merely some embodiments of the present disclosure. For those skilled in the art, other drawings may be obtained according to these drawings without paying any creative effort.

FIG. 10 illustrates a schematic flowchart of a power regulation method according to yet a still further embodiment of the present disclosure.

FIG. 11 illustrates a functional block diagram of a power regulation apparatus according to an embodiment of the present disclosure.

DETAILED DESCRIPTION OF EMBODIMENTS

Figure 1:
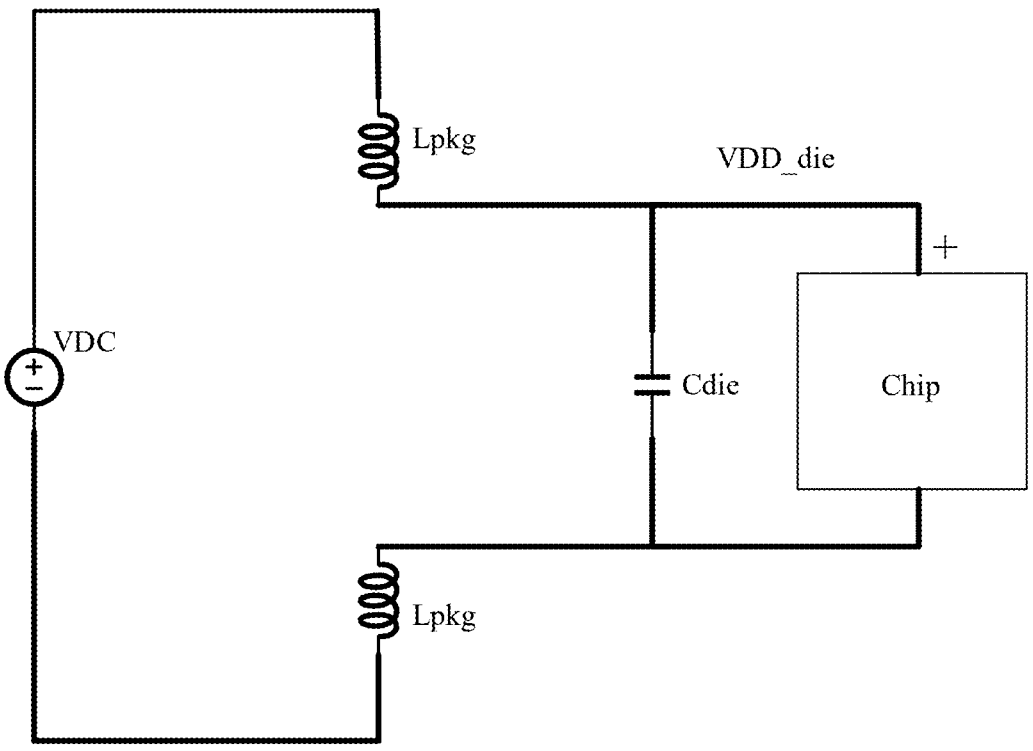
FIG. 1 illustrates a schematic circuit diagram of a power circuit for a chip in the related art.

In order to clearly render purposes, technical schemes and advantages in the embodiments of the present disclosure, the technical schemes in the embodiments of the present disclosure will be clearly and completely described below, in conjunction with the drawings in the embodiments of the present disclosure. Apparently, the described embodiments are merely some, not all, of the embodiments of the present disclosure. Generally, the components of the embodiments of the present disclosure described and illustrated in the drawings herein may be arranged and designed in different configurations.

Therefore, the following detailed description of the embodiments of the disclosure according to the accompanying drawings is not intended to limit the scope of the claimed disclosure, but merely represents selected embodiments of the present disclosure. Based on the embodiments in the present disclosure, all other embodiments, obtained by those of ordinary skill in the art without making creative efforts, fall within the scope of protection of the present disclosure.

It is notable that similar numerals and letters indicate similar items in the following drawings; therefore, once an item is defined in one drawing, it does not need to be further defied and explained in subsequent drawings.

In the description of the present disclosure, it is notable that the terms "first", "second", "third" and so on are only used for distinction, and should not be understood as indicating or implying relative importance.

In the description of the present disclosure, it is also notable that, unless otherwise clearly stipulated and limited, the terms "provide", "install", "connect to", and "connect" should be understood in a broad sense, for example, it may be a fixed connection, a detachable connection or an integral connection; it may be a mechanical connection or an electrical connection; it may be a direct connection or an indirect connection through an intermediate medium, and it may be internal communication of two components. Those of ordinary skill in the art may understand, according to a specific situation, the specific meanings of the above terms of the present disclosure.

Technical schemes in the embodiments of the present disclosure will be described clearly and comprehensively below in combination with the drawings in the embodiments of the present disclosure. Apparently, the described embodiments are merely some, not all, of the embodiments of the present disclosure. Based on the embodiments in the present disclosure, all other embodiments, obtained by those of ordinary skill in the art without making creative efforts, fall within the scope of protection of the present disclosure.

Modern very large scale integration (VLSI) systems are becoming larger and larger, with a higher and higher working frequency, and a higher and higher working current, whereas the power voltage thereof is getting lower and lower. That is, the requirements for the tolerance of the power supply are getting stricter and stricter, which results in a challenging issue in the power integrity of the chip.

The issue of power integrity of the integrated circuits is closely related to parasitic RLC parameters of the packaged power circuit. For example, resistance R in the parasitic RLC would increase the DC error of the power supply, and the LC circuit in the parasitic RLC would increase the power ripple and noise interference. With the development of packaging technology, the RLC parasitic parameters are well suppressed, such as in flip-chip packaging. However, advanced packaging represents an expensive cost.

As illustrated in FIG. 1, in the related art, in order to solve the issue of power integrity and ensure the stability of an internal power supply VDD_die of the chip, a decoupling capacitor Cdie is provided at the chip. However, this scheme does not always play a decoupling role, and sometimes is even more harm than good. Generally, a packaged parasitic inductor Lpkg and an on-chip decoupling capacitor Cdie of the power supply would oscillate, to make the resonant frequency of the power supply match the working frequency of the chip, so as to ensure the integrity of the power supply for the chip. However, due to the configured parameters of decoupling capacitor Cdie and inductor Lpkg, the resonant frequency of the power supply is also fixed. Therefore, if the working frequency of the chip changes, the resonant frequency of the power supply does not match the working frequency of the chip, which cannot ensure the integrity of the power supply for the chip.

In addition, because the packaged parasitic inductor Lpkg of the power supply and the on-chip decoupling capacitor Cdie would oscillate, if the oscillation frequency is the same as the working frequency of the chip, the internal power ripple of the chip would be large, which may exceed the tolerance required for the power voltage of the chip.

Figure 2:
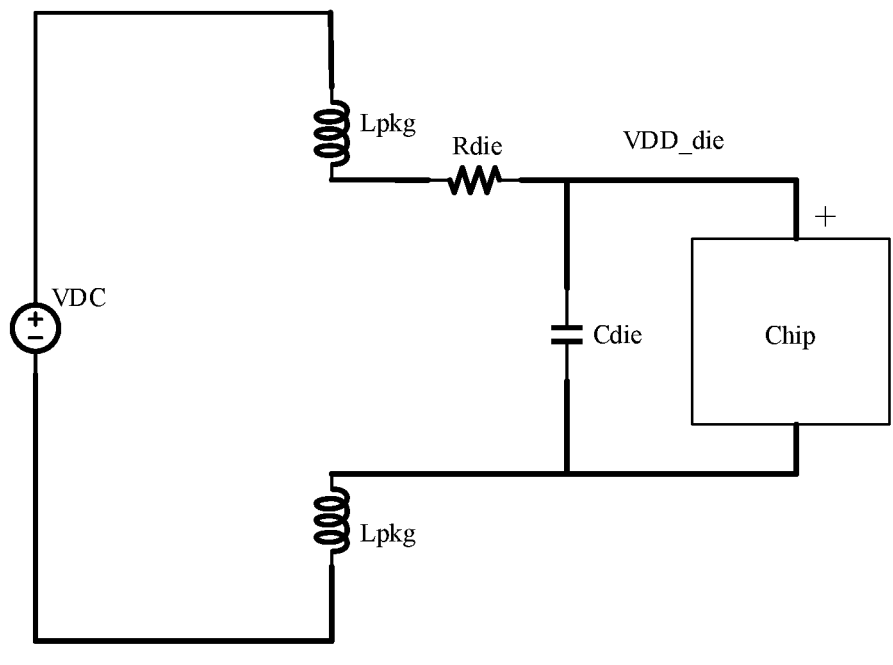
FIG. 2 illustrates a schematic circuit diagram of a power circuit for a chip according to an embodiment of the present disclosure.

The inventors found that, as illustrated in FIG. 2, if a resistor Rdie is connected in series between the parasitic inductor Lpkg and the positive pole of the chip, the oscillation may be effectively prevented, thus avoiding the ripple, but the DC error is increased.

Figure 3:
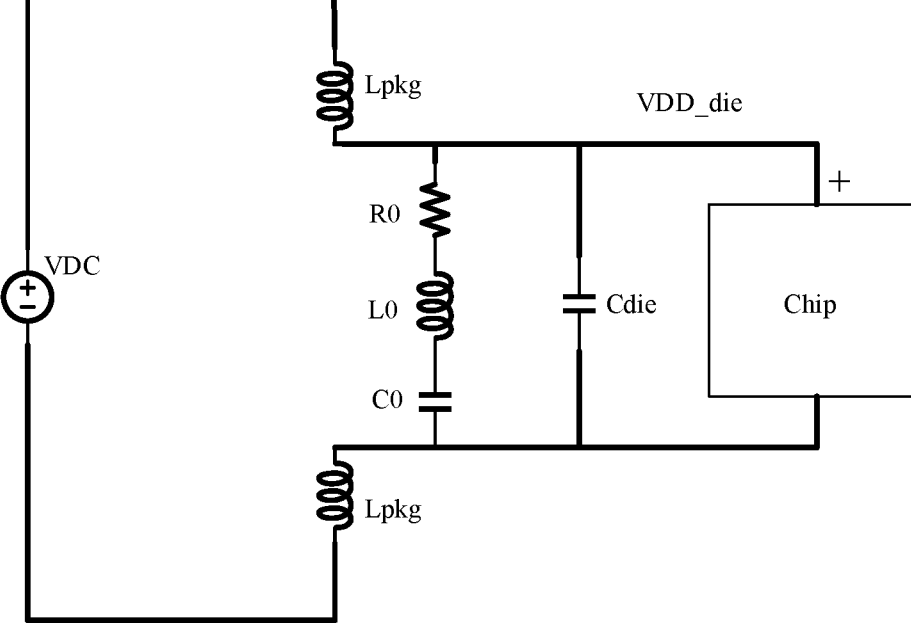
FIG. 3 illustrates a schematic circuit diagram of a power circuit for a chip according to another embodiment of the present disclosure.

The inventors continued to study and found that, as illustrated in FIG. 3, an RLC resonant circuit may be connected in parallel across the decoupling capacitor Cdie. The RLC circuit provides a zero-point impedance R0 at its resonant frequency $fr=1/(2\Pi\sqrt{L0*C0})$, which can prevent the oscillation at this frequency, thus stabilizing the internal power supply VDD_die of the chip.

However, the method still has the defect of being unable to match the different working frequencies of the chip: it can only stabilize the power supply at a single resonant frequency, and only provide a single zero-point impedance; and due to process deviation and temperature change, its frequency changes greatly, and there is a great difference between the zero-point impedance and the actual working current, which may easily cause a too large power ripple that exceeds the tolerance required for the power supply. Therefore, this method is only limited to application scenarios where the chip is at a single fixed working frequency and a single fixed working current, and it renders low accuracy of the frequency and zero-point impedance, high difficulty in the packaging design and a long design cycle.

Therefore, in view of the above problems, the inventors propose a power regulation circuit and method for a chip in the embodiments of the present disclosure, which can avoid the limitation to the application scenarios where the chip is at a single fixed working frequency and a single fixed working current. In addition, this alleviates the problems that a too large power ripple exceeding the tolerance required for the power supply may be easily caused by the unstable frequency and a great difference between the zero-point impedance and the actual working current; and alleviates the problems of high difficulty in the packaging design and a long design cycle.

Figure 4:
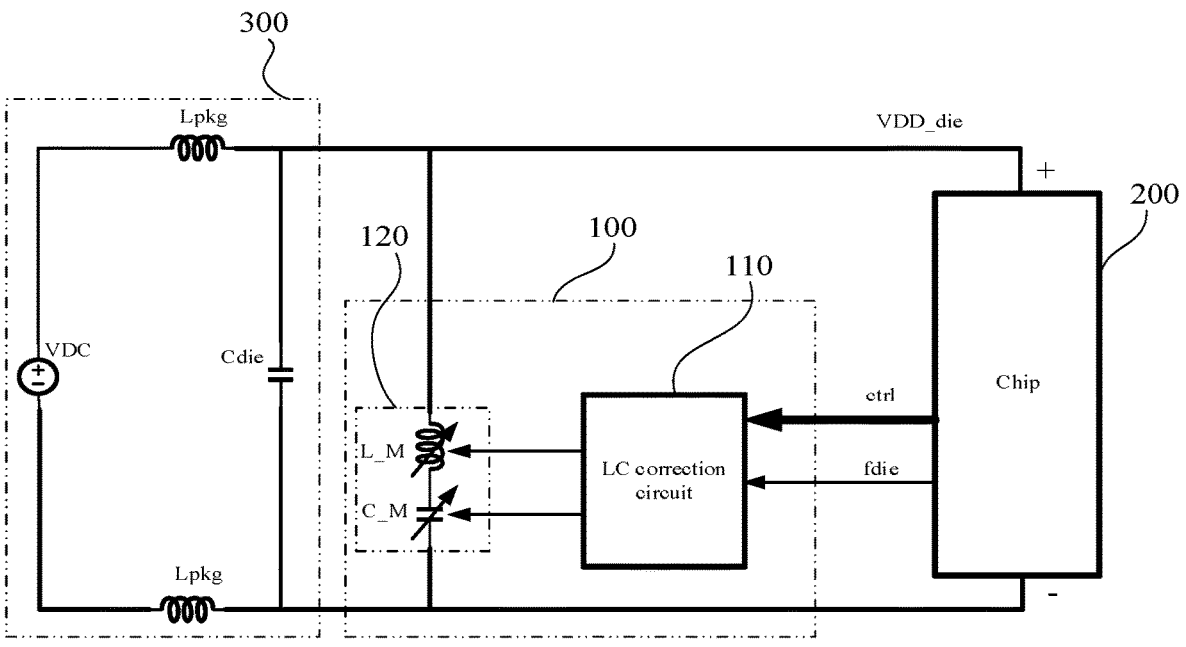
FIG. 4 illustrates a schematic circuit diagram of a power regulation circuit according to an embodiment of the present disclosure.

Referring to FIG. 4, a schematic circuit diagram of a power regulation circuit according to an embodiment of the present disclosure is illustrated. A power regulation circuit 100 may be applied to a chip 200 illustrated in FIG. 4, where the chip 200 together with a power supply 300 defines a loop. The power regulation circuit 100 for the chip may include an LC correction circuit 110 and an LC circuit 120.

In practical applications, one terminal of LC circuit 120 may be electrically connected to each of a positive pole of the chip 200 and a positive pole of the power supply 300;

and the other terminal of the LC circuit 120 may be electrically connected to each of a negative pole of the chip 200 and a negative pole of the power supply 300. The LC correction circuit 110 may be electrically connected to each of the chip 200 and the LC circuit 120, and is used to adjust a working parameter of the LC circuit 120 according to a current working mode of the chip 200.

In some implementations, an on-chip decoupling capacitor Cdie and two parasitic inductors Lpkg may be packaged in the power supply 300, that is, the power supply 300 includes a power supply VDC, an on-chip decoupling capacitor Cdie, and two parasitic inductors Lpkg. A first terminal of the on-chip decoupling capacitor Cdie is electrically connected to each of a positive pole of the power supply VDC and the positive pole of the chip 200, and a second terminal of on-chip decoupling capacitor Cdie is electrically connected to each of a negative pole of the power supply VDC and the negative pole of the chip. Among them, one parasitic inductor Lpkg is connected in series between the on-chip decoupling capacitor Cdie and the positive pole of the power supply VDC. One parasitic inductor Lpkg is connected in series between the on-chip decoupling capacitor Cdie and the negative pole of the power supply VDC.

When the power supply VDC needs to supply power to the chip 200, the LC correction circuit 120 may detect the current working mode of the chip 200, and adjust the working parameter of the LC circuit 120 according to the current working mode of the chip 200. In an implementation, mapping relationships between multiple working modes of the chip 200 and multiple working parameters of the LC circuit 120 may be defined in advance, where each working mode of the chip 200 corresponds to one working parameter of the LC circuit 120. Then, the LC correction circuit 110 may determine whether the current working parameter of the LC circuit 120 matches the current working mode of the chip 200. If the current working parameter of the LC circuit 120 does not match the current working mode of the chip 200, the current working parameter of the LC circuit 120 is adjusted into a working parameter matching the current working mode of the chip 200. If the current working parameter of the LC circuit 120 matches the current working mode of the chip 200, no processing is required. In an implementation, since the chip 200 has different parameters, such as different current, working frequencies and voltage, in different working modes, the LC correction circuit 110 may detect the parameters, such as the current, working frequency and voltage, of the chip 200 to determine the current working mode of the chip 200. The working parameter of the LC circuit 120 may be the resonant frequency.

It is understandable that, when the current working parameter of the LC circuit 120 matches the current working mode of the chip 200, the stability of the power supply VDD_die of the chip 200 and the power integrity of the chip 200 can be ensured.

As can be seen that, in the embodiment, the power regulation circuit 100 for the chip 200 is constituted by the LC circuit 120 and the LC correction circuit 110. One terminal of the LC circuit 120 is electrically connected to each of the positive pole of the chip 200 and the positive pole of the power supply 300, and the other terminal of the LC circuit 120 is electrically connected to each of the negative pole of the chip 200 and the negative pole of the power supply 300. The LC correction circuit 110 is electrically connected to each of the chip 200 and the LC circuit 120. When the power supply 300 supplies power to the chip 200, the LC correction circuit 110 may adjust the working parameters of the LC circuit 120 according to the current working mode of the chip 200, thereby enabling self-adaptation of the resonant frequency of the power supply; and even if the working frequency of the chip 200 changes due to the change of the working mode thereof, the power integrity of the chip 200 can be ensured.

Referring to FIG. 4 again, the LC circuit 120 includes an adjustable capacitor C_M and an adjustable inductor L_M. One terminal of a series circuit constituted by the adjustable capacitor C_M and the adjustable inductor L_M connected in series with each other may be electrically connected to each of the positive pole of the chip 200 and the positive pole of the power supply, and the other terminal of the series circuit constituted by the adjustable capacitor C_M and the adjustable inductor L_M connected in series with each other may be electrically connected to each of the negative pole of the chip 200 and the negative pole of the power supply 300.

The LC correction circuit 110 may be electrically connected to each of the adjustable capacitor C_M and the adjustable inductor L_M, and is used to adjust an inductance value of the adjustable inductor L_M and a capacitance value of adjustable capacitor C_M, according to the current working mode of the chip 200.

In practical applications, the working parameter of the LC circuit 120 may be the resonant frequency. Based on the calculation formula for the resonant frequency $fr=1/(2\Pi\sqrt{L\_M*C\_M})$, it can be seen that the resonant frequency of the LC circuit 120 may be calculated according to the inductance value of the adjustable inductor L_M and the capacitance value of the adjustable capacitor C_M. Therefore, the LC correction circuit 110 may adjust, according to the current working mode of the chip 200, the inductance value of the adjustable inductor L_M and the capacitance value of the adjustable capacitor C_M, thereby adjusting the resonant frequency of the LC circuit 120, i.e., adjusting the working parameter of the LC circuit 120.

In an implementation, when the working frequency of the chip 200 in the current working mode matches the resonant frequency of the LC circuit 120, it may be determined that the working parameter of the LC circuit 120 matches the current working mode of the chip 200. Therefore, the inductance value of the adjustable inductor L_M and the capacitance value of the adjustable capacitor C_M may be adjusted according to the working frequency of the chip 200 in the current working mode, so that the adjusted resonant frequency of the LC circuit 120 matches the working frequency in the current working mode. In an implementation, when the resonant frequency is consistent with the working frequency, it may be determined that the resonant frequency matches the working frequency. In an implementation, when a difference between the resonant frequency and the working frequency is within a preset difference range, it may be determined that the resonant frequency matches the working frequency.

In an implementation, the LC circuit 120 may also be connected in series with a zero-point impedance, to prevent oscillation and avoid ripples. In an implementation, the zero-point impedance may be a resistor with a fixed resistance value, or an adjustable resistor R_M, which is not limited here.

In the present embodiment, the LC circuit 120 includes the adjustable capacitor C_M and the adjustable inductance L_M, one terminal of the series circuit constituted by the adjustable capacitor C_M and the adjustable inductance L_M connected in series with each other may be electrically connected to each of the positive pole of the chip 200 and the positive pole of the power supply 300, and the other terminal of the series circuit constituted by the adjustable capacitor C_M and the adjustable inductance L_M connected in series with each other may be electrically connected to each of the negative pole of the chip 200 and the negative pole of the power supply 300. The LC correction circuit 110 may be electrically connected to each of the adjustable capacitor C_M and the adjustable inductor L_M, and is used to adjust, according to the current working mode of the chip 200, the inductance value of the adjustable inductor L_M and the capacitance value of the adjustable capacitor C_M, so to adjust the working parameter of the LC circuit 120 conveniently and effectively.

Figure 5:
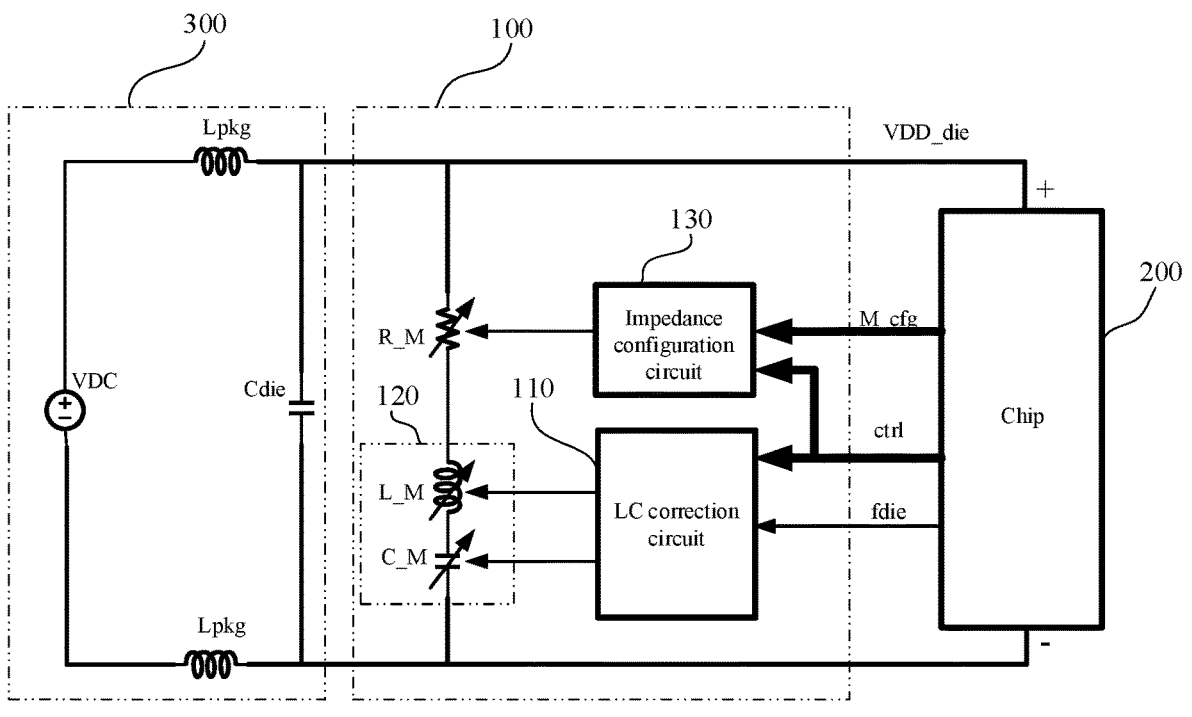
FIG. 5 illustrates a schematic circuit diagram of a power regulation circuit according to another embodiment of the present disclosure.

Referring to FIG. 5, in some embodiments, the power regulation circuit may further includes: an adjustable resistor R_M and an impedance configuration circuit 130.

One terminal of a series circuit constituted by the adjustable resistor R_M and the LC circuit 120 connected in series with each other may be electrically connected to each of the positive pole of the chip 200 and the positive pole of the power supply 300, and the other terminal of the series circuit constituted by the adjustable resistor R_M and the LC circuit 120 connected in series with each other may be electrically connected to each of the negative pole of the chip 200 and the negative pole of the power supply 300.

The impedance configuration circuit 130 is electrically connected to each of the chip 200 and the adjustable resistor R_M, and is used to adjust a resistance value of the adjustable resistor R_M according to the current working mode of the chip 200. In an implementation, the impedance configuration circuit 130 and the LC correction circuit 110 may be packaged together or provided separately, which is not limited.

In practical applications, the impedance configuration circuit 130 may detect the current working mode of the chip 200, and adjust the resistance value of the adjustable resistor R_M according to the current working mode of the chip 200. In an implementation, mapping relationships between multiple working modes of the chip 200 and multiple resistance values of the adjustable resistor R_M may be defined in advance, where each working mode of the chip 200 corresponds to one resistance value of the adjustable resistor R_M. Then, the impedance configuration circuit 130 may determine whether the current resistance value of the adjustable resistor R_M matches the current working mode of the chip 200. If the current resistance value of the adjustable resistor R_M does not match the current working mode of the chip 200, the current resistance value of the adjustable resistor R_M is adjusted to a resistance value matching the current working mode of the chip 200. If the current resistance value of the adjustable resistor R_M matches the current working mode of the chip 200, no processing is required.

When the current resistance value of the adjustable resistor R_M matches the current working mode of the chip 200, it may be determined that the power voltage of the chip 200 is within the power tolerance. Specifically, the impedance configuration circuit 130 may detect the working current of the chip 200 in the current working mode, and adjust, according to the working current, the current resistance value of the adjustable resistor R_M. As an example, since the real-time power voltage of the chip 200 is equal to a product of the working current of the chip 200 and the adjustable resistor R_M, when the difference between the rated voltage of the chip 200 and the product of the working current of the chip 200 and the resistance value of the adjustable resistor R_M is not more than ±5%, it may be determined that the resistance value of the adjustable resistor R_M matches the current working mode of the chip 200. Therefore, it is ensured that the power voltage of the chip 200 is within the power tolerance.

Considering that if an oscillation frequency of the LC circuit is the same as the working frequency of the chip, the internal power ripple of the chip would be large and it may exceed the tolerance required. In the embodiment, the adjustable resistor is provided, where one terminal of the series circuit constituted by the adjustable resistor and the LC circuit connected in series with each other may be electrically connected to each of the positive pole of the chip and the positive pole of the power supply, and the other terminal of the series circuit constituted by the adjustable resistor and the LC circuit connected in series with each other may be electrically connected to each of the negative pole of the chip and the negative pole of the power supply; as such, the zero-point impedance is configured to prevent oscillation and avoid the ripple. In addition, the impedance configuration circuit is provided to be electrically connected to each of the chip and the adjustable resistor, and it is used to adjust, according to the current working mode of the chip, the resistance value of the adjustable resistor, to configure the zero-point impedance accordingly, so as to provide a zero-point impedance that matches the actual working mode of the chip, thereby avoiding a too large power ripple that exceeds the power tolerance required.

Figure 6:
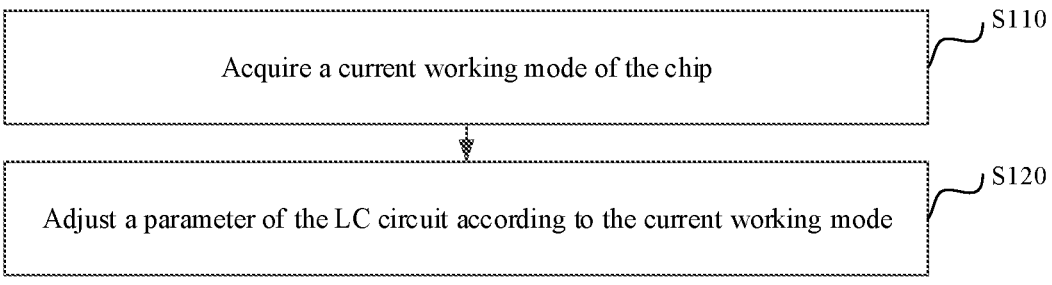
FIG. 6 illustrates a schematic flowchart of a power regulation method according to an embodiment of the present disclosure.

Referring to FIG. 6, a schematic flowchart of a power regulation method according to an embodiment of the present disclosure is illustrated. This method may be applied to the power regulation circuit illustrated in FIG. 4 of the above embodiments, which may be specifically applied to the LC correction circuit, and the method may include operations as follows.

S110, a current working mode of the chip is acquired.

In some embodiments, since the chip has different parameters, such as different currents, working frequencies, voltages and power, in different working modes, the LC correction circuit may detect the parameters, such as the current, working frequency, voltage and power, of the chip to determine the current working mode of the chip. Specifically, ranges of various working parameters of the chip in different working modes may be recorded in advance, as an example, they are illustrated in Table 1.

TABLE 1

| Working mode | Current (mA) | Working frequency (GHz) | Voltage (V) |
|---|---|---|---|
| Working mode 1 | a1~a2 | b1~b2 | c1~c2 |
| Working mode 2 | a3~a4 | b3~b4 | c3~c4 |
| Working mode 3 | a5~a6 | b5~b6 | c5~c6 |

As can be seen that, according to Table 1 and any one or more parameters among the current, working frequency, and voltage of the chip, the current working mode of the chip may be queried. For example, when the current of the chip is detected as A, and A is in a range of a3~a4, it may be determined that the current working mode of the chip is working mode 2. For another example, when the current working frequency of the chip is detected as B, and B is in a range of b5~b6, it may be determined that the current working mode of the chip is working mode 3. In a similar fashion, the current working mode of the chip may be quickly and effectively obtained according to Table 1.

S120, a working parameter of the LC circuit is adjusted according to the current working mode.

In some embodiments, each working mode of the chip corresponds to one working parameter of the LC circuit, and then the LC correction circuit may determine whether the current working parameter of the LC circuit matches the current working mode of the chip. If the current working parameter of the LC circuit does not match the current working mode of the chip, the current working parameter of the LC circuit is adjusted into a working parameter matching the current working mode of the chip. If the current working parameter of the LC circuit matches the current working mode of the chip, no processing is required. The working parameter of the LC circuit may include the resonant frequency of the LC circuit.

It is understandable that, when the working parameter of the LC circuit matches the current working mode of the chip, for example, when the resonant frequency of the LC circuit is consistent with the working frequency of the chip in the current working mode, the power integrity of the chip can be ensured, which ensures that the power supply can stably supply power to the chip.

In the embodiment, by acquiring the current working mode of the chip, and adjusting, according to the current working mode, the working parameter of the LC circuit, the power configuration parameter of the chip may be self-adaptively adjusted to match the working mode of the chip quickly and effectively, and the problem, that the requirement for the power integrity of the chip cannot be met due to the single and unchangeable power configuration parameter when the working mode of the chip changes, is avoided.

Figure 7:
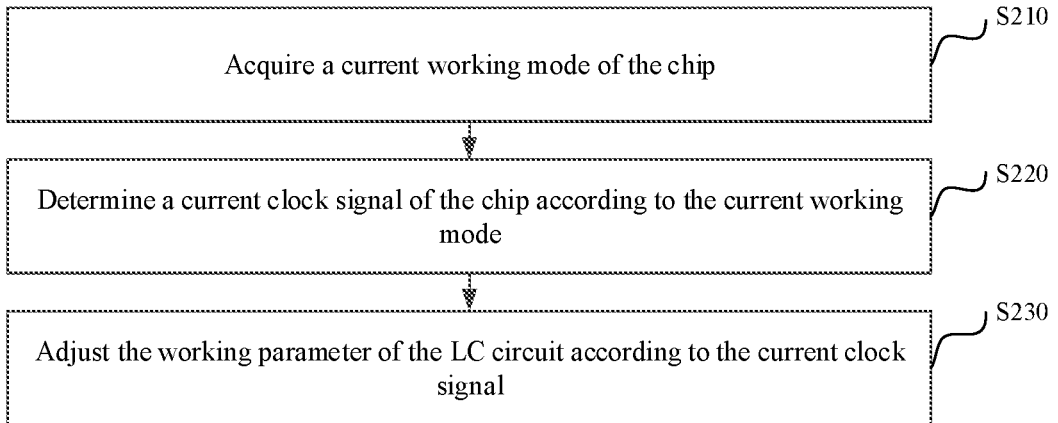
FIG. 7 illustrates a schematic flowchart of a power regulation method according to another embodiment of the present disclosure.

Referring to FIG. 7, a schematic flowchart of a power regulation method according to another embodiment of the present disclosure is illustrated. This method may be applied to the LC correction circuit of the power regulation circuit illustrated in FIG. 4 of the above embodiments, the method may include operations as follows.

S210, a current working mode of the chip is acquired.

For the specific implementation of S210, reference may be made to S110, and the details thereof are not repeated here.

S220, a current clock signal of the chip is determined according to the current working mode.

The clock signal of the chip may also refer to a clock frequency of the chip, which is equivalent to the working frequency of the chip.

Based on the contents of the foregoing embodiments, in some implementations, when the parameter of the chip detected by the LC correction circuit includes the working frequency, the working frequency may be directly determined as the current clock signal of the chip.

In some other embodiments, if the parameter of the chip detected by the LC correction circuit does not include the working frequency, the current working mode of the chip may be determined according to Table 1 and other detected parameters of the chip (such as the voltage and current), and then the working frequency corresponding to the current working mode may be found according to Table 1, so as to obtain the current clock signal of the chip. In an implementation, when the working frequency corresponding to the current working mode is a range illustrated in Table 1, an average obtained from the range may be considered as the current clock signal, or a minimum value of the range may be considered as the current clock signal, or a maximum value of the range may be considered as the current clock signal, which may be set according to the actual situation.

S230, a working parameter of the LC circuit is adjusted according to the current clock signal.

In some implementations, S230 may be specifically implemented by adjusting, according to the current clock signal, the inductance value of the adjustable inductor and the capacitance value of the adjustable capacitor, to adjust the resonant frequency of the LC circuit, where the adjusted resonant frequency matches the current clock signal.

As an example, the clock signal fdie of the chip is output to the LC correction circuit of the power regulation circuit. Based on the calculation formula for the resonant frequency $fr=1/(2\Pi\sqrt{L\_M*C\_M})$, it can be seen that the LC correction circuit may adjust the adjustable capacitor C_M or/and the adjustable inductor L_M, to realize fr=fdie, thereby stabilizing the power supply VDD_die of the chip. Similarly, when the working mode of the chip changes, the working frequency of the chip would also change, and in this case, the resonant frequency fr of the power regulation circuit is adjusted in real time according to the working frequency fdie of the chip, so as to enable the self-adaptive function, and prevent affects by the process deviation and temperature change.

Considering that the clock signal of the chip reflects the working frequency, and the relationship between the working frequency and the resonant frequency of the power supply is an important indicator of the power integrity, in the embodiment, by determining the current clock signal of the chip according to the current working mode, and adjusting the working parameters of the LC circuit according to the current clock signal, the working parameter of the LC circuit can be quickly and effectively adjusted to match the working mode of the chip, so as to ensure the power integrity of the chip.

Figure 8:
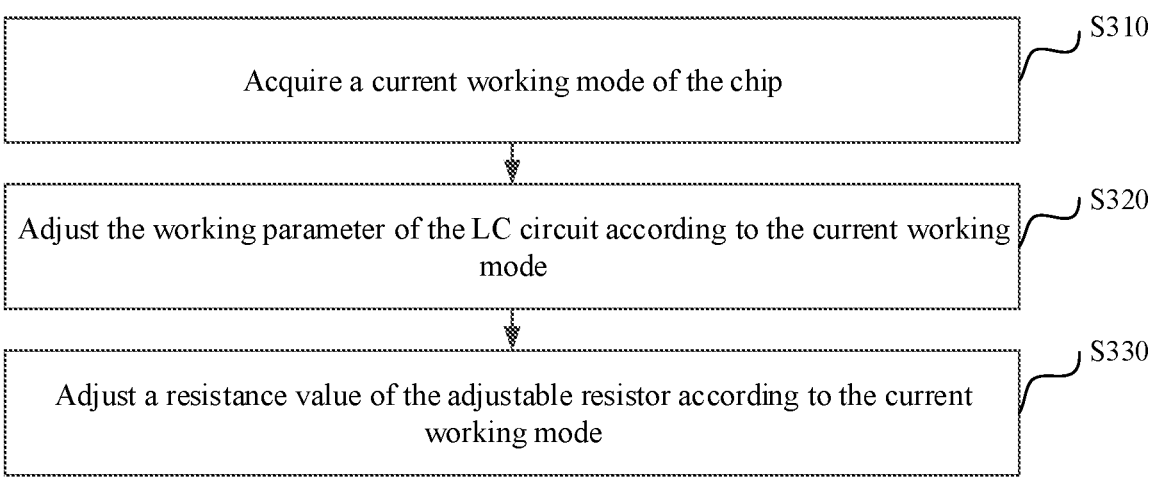
FIG. 8 illustrates a schematic flowchart of a power regulation method according to a further embodiment of the present disclosure.

Referring to FIG. 8, a schematic flowchart of a power regulation method according to a further embodiment of the present disclosure is illustrated. This method may be applied to the power regulation circuit illustrated in FIG. 5 of the above embodiments, and it may be specifically applied to the LC correction circuit and the impedance configuration circuit illustrated in FIG. 5, and the method may include operations as follows.

S310, a current working mode of the chip is acquired.

S320, a working parameter of the LC circuit is adjusted according to the current working mode.

For specific implementations of S310 to S320, reference may be made to S110 to S120, and details thereof are not repeated here.

S330, a resistance value of the adjustable resistor is adjusted according to the current working mode.

In some implementations, as illustrated in FIG. 5, an adjustable resistor, i.e., zero-point impedance, may be connected in series with the LC circuit to prevent the working frequency fdie of the chip from oscillating, thereby further stabilizing the power supply VDD_die of the chip. The resistance value of the zero-point impedance needs to match the working mode of the chip, to avoid a too large power ripple that exceeds the power tolerance required. Therefore, it needs to adjust the resistance value of the adjustable resistor according to the current working mode of the chip.

As an example, resistance value mapping relationships between different working modes of the chip and different resistance values of the adjustable resistor may be established in advance, and the specific establishment may refer to that in Table 1. The impedance configuration circuit may determine the resistance value corresponding to the current working mode, according to the resistance value mapping relationships and the current working mode of the chip. If the current resistance value of the adjustable resistor is inconsistent with the resistance value corresponding to the current working mode, the current resistance value of the adjustable resistor may be adjusted to the resistance value corresponding to the current working mode. If the current resistance value of the adjustable resistor is consistent with the resistance value corresponding to the current working mode, no processing is required.

Considering that the working current of the chip changes as the working mode of the chip changes, if the zero-point impedance is fixed, there may be a great difference from the actual working current of the chip, which would easily cause a too large power ripple that exceeds the power tolerance required. In the embodiment, by adjusting the resistance value of the adjustable resistor according to the current working mode, it is ensured that the resistance value of the zero-point impedance may also be adjusted adaptively when the working mode of the chip changes, so as to avoid a too large power ripple that exceeds the power tolerance required.

Figure 9:
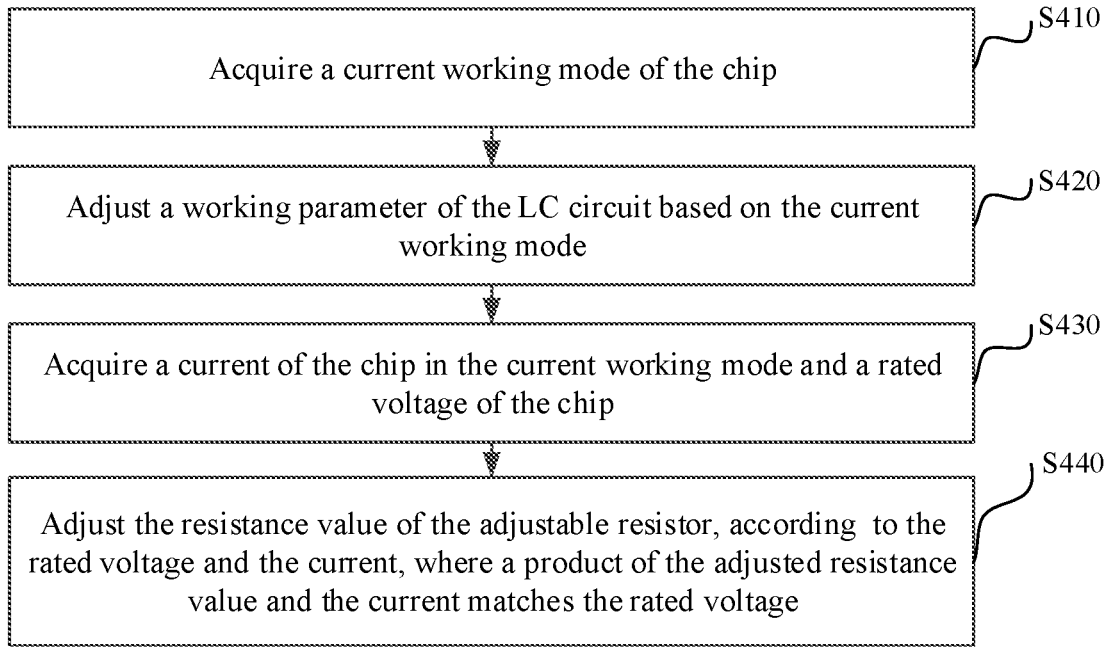
FIG. 9 illustrates a schematic flowchart of a power regulation method according to yet a further embodiment of the present disclosure.

Referring to FIG. 9, a schematic flowchart of a power regulation method according to yet a further embodiment of the present disclosure is illustrated. This method may be applied to the power regulation circuit illustrated in FIG. 5 of the above embodiments, the method may include operations as follows.

S410, a current working mode of the chip is acquired.

S420, a working parameter of the LC circuit is adjusted according to the current working mode.

For the specific implementations of S410 to S420, reference may be made to S110 to S120, and details thereof are not repeated here.

S430, a current of the chip in the current working mode and a rated voltage of the chip are acquired.

In some embodiments, after the working mode of the chip is determined, the current corresponding to the current working mode may be obtained by searching in table 1, that is, the current in the current working mode is obtained. In an implementation, the rated voltage of the chip may be pre-stored in a storage module of the impedance configuration circuit for invoking, and the impedance configuration circuit may first identify identifier information such as the model of the chip, and then invoke, according to the identifier information, the rated voltage corresponding to the identifier information from the storage module. Mapping relationships between identifier information of different chips and different rated voltages may also be pre-stored in the impedance configuration circuit.

S440, the resistance value of the adjustable resistor is adjusted according to the rated voltage and the current, where a product of the adjusted resistance value and the current matches the rated voltage.

As an example, it may be detected whether the product of the resistance value of the adjustable resistor and the current in the current working mode is consistent with the rated voltage. If the product of the resistance value of the adjustable resistor and the current in the current working mode is consistent with the rated voltage, no processing is required; and if the product of the resistance value of the adjustable resistor and the current in the current working mode is inconsistent with the rated voltage, the resistance value of the adjustable resistor may be adjusted, so that the product of the adjusted resistance value of the adjustable resistor and the current in the current working mode is consistent with the rated voltage. Thus, the power voltage of the chip is ensured to be within the tolerance.

In an implementation, the chip may generate a configuration bus signal M_cfg according to the rated voltage and the current, and send the configuration bus signal M_cfg to the impedance configuration circuit, to instruct the impedance configuration circuit to adjust the resistance value of the adjustable resistor to a resistance value corresponding to the configuration bus signal M_cfg.

In some implementations, the operation of adjusting the resistance value of the adjustable resistor according to the rated voltage and the current in S440 may be specifically implemented as: in response to detecting that the absolute value of a difference between the rated voltage and the product of the adjusted resistance value and the current does not exceed a specified value, determining that the product of the adjusted resistance value and the current matches the rated voltage, and stopping the adjustment of the adjustable resistor.

As an example, the specified value may be 5% of the rated voltage X of the chip, that is, (5% X)V. If the absolute value of the difference between the rated voltage X and the product of the adjusted resistance value and the current is 3% X, it may be determined that the product of the adjusted resistance value and the current matches the rated voltage, and the adjustment of the adjustable resistor is stopped. The specified value may be related to the performance parameter of the chip, and the specified value may be different for different chips.

Considering that the power tolerance may be different for different chips, in the embodiment, the current of the chip in the current working mode and the rated voltage of the chip are acquired, and the resistance value of the adjustable resistor is adjusted according to the rated voltage and the current, where the product of the adjusted resistance value and the current matches the rated voltage. In this way, a zero-point impedance that matches the actual working current can be provided, thereby avoid a too large power ripple that exceeds the power tolerance required.

Referring to FIG. 10, a schematic flowchart of a power regulation method according to yet a still further embodiment of the present disclosure is illustrated. This method may be applied to the power regulation circuit illustrated in FIG. 5 in the above embodiments, and the method may include operations as follows.

S510, an enabling signal output from the chip is received.

The enabling signal may be used to control a working state of the impedance configuration circuit and a working state of the LC correction circuit, where the working states of the impedance configuration circuit and the LC correction circuit may include an on state, an off state, and the like.

In some embodiments, when the chip is switched into the working state, the enabling signal may be generated and sent to the impedance configuration circuit and the LC correction circuit, so as to control the working states of the impedance configuration circuit and the LC correction circuit according to the enabling signal. The enabling signal may specifically be the configuration bus signal ctrl illustrated in FIG. 5.

S520, the working states of the impedance configuration circuit and the LC correction circuit are controlled according to the enabling signal.

As an example, before the chip is switched into the working state, the impedance configuration circuit is in the off state, and the LC correction circuit is in the off state; and when the chip is switched into the working state, the impedance configuration circuit and the LC correction circuit receive the enabling signal output by the chip, and the enabling signal is used to instruct the impedance configuration circuit and the LC correction circuit to be turned on, and at this time, the impedance configuration circuit and the LC correction circuit may be controlled to be turned on.

S530, a current working mode of the chip is acquired.

S540, a current clock signal of the chip is determined according to the current working mode.

S550, a working parameter of the LC circuit is adjusted according to the current clock signal.

For specific implementations of S530 to S540, reference may be made to S210 to S230, and details thereof are not repeated here.

S560, a current of the chip in the current working mode and a rated voltage of the chip are acquired.

S570, a resistance value of the adjustable resistor is adjusted according to the rated voltage and the current, where the product of the adjusted resistance value and the current matches the rated voltage.

For specific implementations of S560 to S570, reference may be made to S430 to S440, and details thereof are not repeated here.

In an implementation, when the product of the adjusted resistance value and the current matches the rated voltage, and the adjusted working parameter of the LC circuit matches the working mode of the chip, the working states of the impedance configuration circuit and the LC correction circuit may be adjusted to be off to save power. When subsequent switching of the working state of the chip is detected, the impedance configuration circuit and the LC correction circuit may be turned on again.

As a specific example, the power regulation method in the embodiment may be applied to a power supply circuit for a chip as illustrated in FIG. 5, and the circuit may include an on-chip decoupling capacitor Cdie, a power regulation circuit, and a chip. One terminal of the on-chip decoupling capacitor Cdie is connected to the internal power supply VDD_die of the chip, and the other terminal thereof is connected to ground of the chip. One terminal of the power regulation circuit is connected to the internal power supply VDD_die of the chip, and the other terminal of the power regulation circuit is connected to ground of the chip. The power regulation circuit is connected in parallel with the on-chip decoupling capacitor Cdie. The chip is connected to the power regulation circuit through the chip clock signal fdie, the control bus signal ctrl, and the configuration bus signal M_cfg.

The power regulation circuit includes: an adjustable capacitor C_M, an adjustable inductor L_M, an LC correction circuit, an adjustable resistor R_M, and an impedance configuration circuit.

When the power supply circuit for a chip is working, the chip outputs the chip clock signal fdie to the LC correction circuit of the power regulation circuit. Based on the calculation formula for the resonant frequency $fr=1/(2\Pi\sqrt{L\_M*C\_M})$, it can be seen that the LC correction circuit may adjust the capacitor C_M or/and the inductor L_M to realize fr=fdie. In addition, the adjustable resistor R_M is provided at fr to serves as the zero-point impedance, so as to prevent oscillation at the working frequency fdie, thereby stabilizing the internal power supply VDD_die of the chip. In this way, the resonant frequency fr of the power regulation circuit can be adjusted in real-time according to the working frequency fdie of the chip, to enable the self-adaptive function, and prevent affects by the process deviation and temperature change.

The chip may output, according to the working mode and current of the chip, the corresponding configuration bus signal M_cfg to the impedance configuration circuit in the power regulation circuit, and the impedance configuration circuit provides a zero-point impedance that matches the actual working current by adjusting the resistor R_M, to avoid a too large power ripple that exceeds the power tolerance required.

Furthermore, the chip may output the control bus signal ctrl to the power regulation circuit to control the power regulation circuit accordingly. Specifically, the control bus signal ctrl is equivalent to an enabling signal, which may be used to control when to turn on or off the impedance configuration circuit and the LC correction circuit in the power regulation circuit.

As can be seen, the chip designed according to this method can adjust its resonant frequency fr according to the working frequency fdie of the chip, so that fr=fdie, and provide a zero-point impedance at fr to prevent oscillation at the working frequency, thereby stabilizing the internal power supply VDD_die of the chip.

Furthermore, the zero-point impedance may be configured according to the working mode and the current of the chip, so as to provide a zero-point impedance matching the actual working current, to prevent a too large power ripple that exceeds the power tolerance required.

As can be seen, the power regulation method provided by the embodiment may endow the chip with strong versatility, and may be applied to various occasions with different working modes, different working frequencies, and different working currents. The self-adaptation of the resonant frequency is enabled, and the zero-point impedance matching the actual working current is enabled, which does not change with the process deviation or temperature change, and significantly reduces the difficulty in packaging design and shortens the design cycle. Moreover, the packaging solution may use a low-cost wire bonding process, and the packaging substrate does not need to provide a filter capacitor, which significantly reduces the packaging cost.

Referring to FIG. 11, a functional block diagram of a power regulation apparatus according to an embodiment of the present disclosure is illustrated. The power regulation apparatus is applied to the power regulation circuit for a chip of the above embodiments. The apparatus 600 includes: a current working mode acquisition module 610 and a working parameter adjustment module 620.

The current working mode acquisition module 610 is configured to acquire a current working mode of the chip.

The working parameter adjustment module 620 is configured to adjust a working parameter of the LC circuit according to the current working mode.

In an implementation, the working parameter adjustment module 620 includes:

a current clock signal determination sub-module, configured to determine a current clock signal of the chip according to the current working mode; and a working parameter adjustment sub-module, configured to adjust the working parameter of the LC circuit according to the current clock signal.

In an implementation, the LC circuit includes an adjustable capacitor and an adjustable inductor connected in series with each other, and the working parameter adjustment sub-module is specifically configured to adjust, according to the current clock signal, an inductance value of the adjustable inductor and a capacitance value of the adjustable capacitor, to adjust the resonant frequency of the LC circuit, where the adjusted resonant frequency matches the current clock signal.

In an implementation, the power regulation circuit for a chip further includes an adjustable resistor and an impedance configuration circuit. The adjustable resistor is connected in series with the LC circuit, and the impedance configuration circuit is electrically connected to each of the chip and the adjustable resistor. The apparatus 600 further includes:

a resistance adjustment module, configure to adjust a resistance value of the adjustable resistor according to the current working mode.

In an implementation, the resistance adjustment module includes:

an information acquisition sub-module, configured to acquire a current of the chip in the current working mode and a rated voltage of the chip; and a resistance adjustment sub-module, configured to adjust, according to the rated voltage and the current, the resistance value of the adjustable resistor, where the product of the adjusted resistance value and the current matches the rated voltage.

In an implementation, the resistance adjustment sub-module is specifically configured to determine the product of the adjusted resistance value and the current matches the rated voltage, and stop the adjustment of the adjustable resistor, when an absolute value of a difference between the rated voltage and the product of the adjusted resistance value and the current does not exceed a specified value.

In an implementation, the apparatus 600 further includes:

an enable signal receiving module, configured to receive an enabling signal output by the chip; and a working state control module, configured to control working states of the impedance configuration circuit and the LC correction circuit, according to the enable signal.

Those skilled in the art may clearly understand that, for the convenience and brevity of the description, the specific working process of the module mentioned above may refer to the corresponding process in the foregoing method embodiments, which will not be repeated here.

In several embodiments provided in the present disclosure, the mutual coupling or direct coupling or communication connection between the modules illustrated or described may be done through some interfaces, and the indirect coupling or communication connection between apparatuses or modules may be electrical, mechanical or in other forms.

In addition, various functional modules in the embodiments of the present disclosure may be integrated into one processing module, or each module may exist alone physically, or two or more modules may be integrated into one module. The integrated modules above may be implemented in hardware or software function modules.

To sum up, the power regulation circuit and method provided in the present embodiments can avoid the limitation to the application scenarios where the chip is at a single fixed working frequency and a single fixed working current. In addition, this alleviates the problems that a too large power ripple exceeding the tolerance required for the power supply may be easily caused by the unstable frequency and a great difference between the zero-point impedance and the actual working current; and alleviates the problems of high difficulty in the packaging design and a long design cycle.

Finally, it is notable that the embodiments above are only used to illustrate the technical schemes of the present disclosure, rather than limiting them. Although the present disclosure has been described in detail with reference to the foregoing embodiments, those of ordinary skill in the art should understand that: modification may still made to the technical schemes recorded in the embodiments above, or equivalent substitution may still made to some technical features, but these modifications or substitutions do not render the essence of the corresponding technical schemes depart from the spirit and scope of the technical schemes of various embodiments of this disclosure.

What is claimed is:

1. A power regulation circuit for a chip, comprising:

an LC circuit;

an adjustable resistor connected in series with the LC circuit, wherein one terminal of a series circuit constituted by the adjustable resistor and the LC circuit is electrically connected to each of a positive pole of the chip and a positive pole of a power supply, and the other terminal of the series circuit constituted by the adjustable resistor and the LC circuit is electrically connected to each of a negative pole of the chip and a negative pole of the power supply;

an LC correction circuit, wherein the LC correction circuit is electrically connected to each of the chip and the LC circuit, and is configured to adjust a working parameter of the LC circuit according a current working mode of the chip; and an impedance configuration circuit, wherein the impedance configuration circuit is electrically connected to each of the chip and the adjustable resistor, and is configured to adjust a resistance value of the adjustable resistor according to the current working mode of the chip;

wherein the impedance configuration circuit is further configured to acquire a current of the chip in the current working mode and a rated voltage of the chip; and adjust the resistance value of the adjustable resistor, according to the rated voltage and the current, wherein a product of the adjusted resistance value and the current matches the rated voltage.

2. The power regulation circuit for a chip of claim 1, wherein the LC correction circuit is configured to determine a current clock signal of the chip, according to the current working mode of the chip; and adjust the working parameter of the LC circuit according to the current clock signal of the chip.

3. The power regulation circuit for a chip of claim 2, wherein the LC correction circuit is configured to determine a working frequency of the chip according to the current clock signal of the chip; and adjust a resonant frequency of the LC circuit according to the working frequency of the chip.

4. The power regulation circuit for a chip of claim 1, wherein the LC circuit comprises an adjustable capacitor and an adjustable inductor connected in series with each other, one terminal of a further series circuit constituted by the adjustable capacitor and the adjustable inductor is electrically connected to one terminal of the adjustable resistor, another terminal of the adjustable resistor is electrically connected to each of the positive pole of the chip and the positive pole of the power supply, and the other terminal of the further series circuit constituted by the adjustable capacitor and the adjustable inductor is electrically connected to each of the negative pole of the chip and the negative pole of the power supply; and the LC correction circuit is electrically connected to each of the adjustable capacitor and the adjustable inductor, and is configured to adjust, according to the current working mode of the chip, an inductance value of the adjustable inductor and a capacitance value of the adjustable capacitor, to make a resonant frequency of the LC circuit match the current working mode of the chip.

5. The power regulation circuit for a chip of claim 1, wherein the impedance configuration circuit is further is configured to determine that the product of the adjusted resistance value and the current matches the rated voltage and stop adjustment of the adjustable resistor, when it is detected that an absolute value of a difference between the rated voltage and the product of the adjusted resistance value and the current does not exceed a specified value.

6. The power regulation circuit for a chip of claim 1, wherein the LC correction circuit is further configured to receive an enabling signal output by the chip; and control a working state of the LC correction circuit according to the enabling signal; and the impedance configuration circuit is further configured to receive the enabling signal output by the chip; and control a working state of the impedance configuration circuit according to the enabling signal.

7. A power regulation method for a chip, wherein the method is implemented by a power regulation circuit for a chip, the power regulation circuit comprises an LC circuit, an LC correction circuit, an adjustable resistor and an impedance configuration circuit, one terminal of a series circuit constituted by the adjustable resistor and the LC circuit is electrically connected to each of a positive pole of the chip and a positive pole of a power supply, and the other terminal of the series circuit constituted by the adjustable resistor and the LC circuit is electrically connected to each of a negative pole of the chip and a negative pole of the power supply, the LC correction circuit is electrically connected to each of the chip and the LC circuit, the impedance configuration circuit is electrically connected to each of the chip and the adjustable resistor, and the method comprises:

acquiring, by the LC correction circuit, a current working mode of the chip;

adjusting, by the LC correction circuit, a working parameter of the LC circuit according to the current working mode of the chip, acquiring a current of the chip in the current working mode and a rated voltage of the chip; and adjusting, by the impedance configuration circuit, a resistance value of the adjustable resistor, according to the rated voltage and the current, wherein a product of the adjusted resistance value and the current matches the rated voltage.

8. The power regulation method for a chip of claim 7, wherein the adjusting a working parameter of the LC circuit according to the current working mode of the chip, comprises:

determining a current clock signal of the chip, according to the current working mode of the chip; and adjusting the working parameter of the LC circuit, according to the current clock signal.

9. The power regulation method for a chip of claim 7, wherein the adjusting a working parameter of the LC circuit according to the current working mode of the chip, comprises:

determining a working frequency of the chip, according to a current clock signal of the chip; and adjusting the working parameter of the LC circuit according to the working frequency of the chip.

10. The power regulation method for a chip of claim 8, wherein the LC circuit comprises an adjustable capacitor and an adjustable inductor connected in series with each other, the adjusting a working parameter of the LC circuit according to the current working mode, comprises:

adjusting, according to the current clock signal, an inductance value of the adjustable inductor and a capacitance value of the adjustable capacitor, to adjust a resonant frequency of the LC circuit, wherein the adjusted resonant frequency matches the current clock signal.

11. The power regulation method for a chip of claim 7, wherein the adjusting the resistance value of the adjustable resistor according to the rated voltage and the current, comprises:

in response to detecting that an absolute value of a difference between the rated voltage and the product of the adjusted resistance value and the current does not exceed a specified value, determining that the product of the adjusted resistance value and the current matches the rated voltage, and stopping adjustment of the adjustable resistor.

12. The power regulation method for a chip of claim 7, further comprising:

receiving an enabling signal output by the chip; and controlling, according to the enabling signal, working states of the impedance configuration circuit and the LC correction circuit.

13. A power supply circuit for a chip, comprising:

a power supply;

an LC circuit;

an adjustable resistor connected in series with the LC circuit, wherein one terminal of a series circuit constituted by the adjustable resistor and the LC circuit is electrically connected to each of a positive pole of the chip and a positive pole of the power supply, and the other terminal of the series circuit constituted by the adjustable resistor and the LC circuit is electrically connected to each of a negative pole of the chip and a negative pole of the power supply;

an LC correction circuit, wherein the LC correction circuit is electrically connected to each of the chip and the LC circuit, and is configured to adjust a working parameter of the LC circuit according a current working mode of the chip; and an impedance configuration circuit, wherein the impedance configuration circuit is electrically connected to each of the chip and the adjustable resistor, and is configured to: acquire a current of the chip in the current working mode and a rated voltage of the chip, and adjust a resistance value of the adjustable resistor, according to the rated voltage and the current, wherein a product of the adjusted resistance value and the current matches the rated voltage.

14. The power supply circuit for a chip of claim 13, wherein the LC circuit comprises an adjustable capacitor and an adjustable inductor connected in series with each other, one terminal of the adjustable capacitor is connected with one terminal of the adjustable inductor, the other terminal of the adjustable capacitor is electrically connected to one terminal of the adjustable resistor, another terminal of the adjustable resistor is electrically connected to each of the positive pole of the chip and the positive pole of the power supply, and the other terminal of the adjustable inductor is electrically connected to each of the negative pole of the chip and the negative pole of the power supply; and the LC correction circuit is electrically connected to each of the adjustable capacitor and the adjustable inductor, and is configured to adjust, according to the current working mode of the chip, an inductance value of the adjustable inductor and a capacitance value of the adjustable capacitor, to make a resonant frequency of the LC circuit match the current working mode of the chip.

15. The power supply circuit for a chip of claim 13, further comprising:

an on-chip decoupling capacitor, wherein a first terminal of the on-chip decoupling capacitor is electrically connected to each of the positive pole of the power supply and the positive pole of the chip, and a second terminal of on-chip decoupling capacitor is electrically connected to each of the negative pole of the power supply and the negative pole of the chip; and two parasitic inductors, wherein one of the two parasitic inductors is connected in series between an the on-chip decoupling capacitor and the positive pole of the power supply, and the other one of the two parasitic inductors is connected in series between the on-chip decoupling capacitor and the negative pole of the power supply.

16. The power supply circuit for a chip of claim 13, wherein the impedance configuration circuit is further is configured to determine that the product of the adjusted resistance value and the current matches the rated voltage and stop adjustment of the adjustable resistor, when it is detected that an absolute value of a difference between the rated voltage and the product of the adjusted resistance value and the current does not exceed a specified value.

* * * * *